United States Patent
Omote et al.

(10) Patent No.: US 8,184,259 B2
(45) Date of Patent: *May 22, 2012

(54) DECORATIVE PLATE FOR CASING AND CASING

(75) Inventors: Ryoumei Omote, Kyoto (JP); Takayuki Takagi, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 361 days.

This patent is subject to a terminal disclaimer.

(21) Appl. No.: 12/593,722

(22) PCT Filed: Jul. 7, 2008

(86) PCT No.: PCT/JP2008/062272
§ 371 (c)(1),
(2), (4) Date: Sep. 29, 2009

(87) PCT Pub. No.: WO2009/008403
PCT Pub. Date: Jan. 15, 2009

(65) Prior Publication Data
US 2010/0128204 A1      May 27, 2010

(30) Foreign Application Priority Data
Jul. 11, 2007   (JP) ................ 2007-181961

(51) Int. Cl.
*G02F 1/13* (2006.01)
(52) U.S. Cl. ............ 349/196; 349/193; 359/320
(58) Field of Classification Search .............. None
See application file for complete search history.

(56) References Cited

FOREIGN PATENT DOCUMENTS

| | | |
|---|---|---|
| JP | 53-003928 | 2/1978 |
| JP | 5-79534 | 10/1993 |
| JP | 11-223680 | 8/1999 |
| JP | 2000-122085 | 4/2000 |
| JP | 2002-333610 | 11/2002 |
| JP | 2003-140149 | 5/2003 |
| JP | 2004-37943 | 2/2004 |
| JP | 2004-258228 | 9/2004 |
| JP | 2008-518346 | 5/2008 |
| WO | 2006/046214 | 5/2006 |

OTHER PUBLICATIONS

Patent Cooperation Treaty (PCT) International Preliminary Report on Patentability issued Apr. 13, 2010 in corresponding International Application No. PCT/JP2008/062272.
International Search Report issued Aug. 12, 2008 in International (PCT) Application No. PCT/JP2008/062272.

*Primary Examiner* — Lucy Chien
(74) *Attorney, Agent, or Firm* — Wenderoth, Lind & Ponack, LLP

(57) ABSTRACT

A decorative plate for a casing is attached to a casing, and utilized. The decorative plate is configured by a plate-shaped transparent base member, a color half mirror layer, placed on the lower face of the transparent base member, that is made of a metal thin film subjected to a tint treatment, a transparency-switching film, formed on the lower face of the color half mirror layer, that is capable of switching between transmitting and non-transmitting states, a transparent reflection-increasing film layer, placed on the lower face of the transparency-switching film, that is a composite film formed by alternately laminating a high refractive-index film and a low refractive-index film, and a backing layer that is formed on the lower face of the reflection-increasing film layer in a tightly contact state without having an air layer interposed therebetween, which are successively laminated.

8 Claims, 5 Drawing Sheets

DECORATIVE PLATE FOR CASING AND CASING

BACKGROUND OF THE INVENTION

1. Technical Field

The present invention relates to a decorative plate for casing that is attached to an outer face of a casing so that a special designing property can be added to the casing, and also concerns such a casing.

2. Description of the Related Art

In recent years, in cosmetics and portable information terminals, such as portable telephones and electronic notebooks, those commodities that are characterized by specific outside appearances, for example, various designs applied thereto, have been known. In addition to those having patterns, examples of designs for such casings include those having characterized outside appearances of the casings themselves, such as those having embossed patterns, those having half mirror patterns, and those having color changes depending on the viewing angles.

SUMMARY OF THE INVENTION

1. Issues to be Solved by the Invention

Those having peculiar designs as described above, however, are considered to be a kind of fashion, and there have been demands one after another for those casings having new outside appearances.

Therefore, one of technical subjects to achieved by the present invention is to provide decorative plate for a casing that can apply a peculiar design to the outside appearance of a casing, and such a casing.

2. Means for Solving the Issues

In order to achieve the above-mentioned technical subject, the present invention provides a decorative plate for a casing having the following structures.

According to a first aspect of the present invention, there is provided a decorative plate for a casing, which is attached to a surface of a casing so as to decorate said casing, characterized by comprising:

a plate-shaped transparent base member;

a color half mirror layer that is placed on a lower side of said transparent base member, and made of a metal thin-film that has been subjected to a tint treatment;

a transparency-switching film that is placed on a lower face of said color half mirror layer, for switching between transmitting and non-transmitting states electrically;

a transparent reflection-increasing film layer that is placed on a lower face of said transparency-switching film, and is a composite layer formed by alternately laminating a high refractive-index film and a low refractive-index film; and, a backing layer that is formed on a lower face of said reflection-increasing film layer in a tightly contact state without having an air layer interposed therebetween, which are successively laminated.

According to a second aspect of the present invention, there is provided the decorative plate for a casing according to the first aspect, characterized in that said transparency-switching film is formed by a polymer dispersion-type liquid crystal film and adapted for switching between transparent and white non-transparent states upon application of a voltage.

According to a third aspect of the present invention, there is provided a decorative plate for a casing relating to the second aspect, characterized in that the decorative plate becomes a white non-transparent state when a voltage is applied thereto, and the decorative plate also becomes a transparent state when no voltage is applied thereto.

According to a fourth aspect of the present invention, there is provided a decorative plate for a casing relating to the first aspect in which the reflection-increasing film layer is made of a layer on which a dielectric film made from a transparent inorganic oxide is laminated.

According to a fifth aspect of the present invention, there is provided the decorative plate for a casing according to the first aspect, characterized in that, in place of said metal thin film that has been subjected to the tint treatment, said color half mirror layer is made of another reflection-increasing film that has been subjected to a tint treatment.

According to a sixth aspect of the present invention, there is provided the decorative plate for a casing according to the first aspect, characterized in that said color half mirror layer is placed on a surface of a transparent film, and formed by bonding said transparent film and said transparent base member to each other, with a surface of said film on a side having no color half mirror layer being made tightly in contact with a surface of said transparent base member.

According to a seventh aspect of the present invention, there is provided the decorative plate for a casing according to the first aspect, characterized in that said backing layer is made of a black solid pattern.

According to an eighth aspect of the present invention, there is provided a casing to a surface of which said decorative plate for a casing according to the first aspect is attached, characterized by comprising:

a voltage-applying unit for switching between application and non-application states of a voltage to said transparency-switching film depending on states of said casing; and a battery housing unit for housing a battery serving as a voltage source for a voltage to be applied by said voltage-applying unit, wherein said decorative plate is allowed to have a different design depending on a state of said casing.

3. Effects of the Invention

In accordance with the present invention, by switching between the transmitting and non-transmitting states of the transparency-switching film formed on the lower face of the color half mirror layer, the visually recognizable state and concealed state between the reflection-increasing film layer and the backing layer that are formed beneath the film can be switched. That is, in a case where the transparency-switching film is in the non-transmitting state, since light, made incident thereon from outside, is reflected by the surfaces thereof, the reflection-increasing layer and the backing layer are concealed from the outside, and are not visually recognized. As a result, the outside appearance of the casing is derived from the color half mirror layer. In contrast, in a case where the transparency-switching film is in the transmitting state, the reflection-increasing layer and the backing layer located beneath the film are visually recognized. As a result, the outside appearance becomes a half mirror state derived from the reflection-increasing layer and the backing layer. At this time, a decorative state, exerted by the reflection-increasing layer and the backing layer, may be prepared as a hue different from the tint of the color half mirror layer. In this case, in the transmitting state of the transparency-switching film, the outside appearance has a mixed hue, with the two hues being mixed with each other. Therefore, by switching between transmitting and non-transmitting states of the transparency-switching film, the appearance of the color half mirror layer can be made different so that it is possible to provide a decorative plate that is superior in designing.

Moreover, when the transparency-switching film is made of a polymer dispersion-type liquid crystal film, it becomes possible to easily switch between the transmitting and non-transmitting states.

Furthermore, in the casing having a surface to which the decorative plate is attached, decorative states may be switched, for example, depending on the opened or closed state of a lid of the casing or states of a portable terminal, or designs of the decorative plate may be made different depending on the states of the casing, such as a state in which the remaining amount of the contents becomes little. Therefore, by observing the decorative state of the casing surface, the state of the casing can be distinguished by even one glance.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE INVENTION

Referring to Figures, the following description will discuss a casing on which a decorative plate for casing in accordance with one embodiment of the present invention is mounted.

Figure 1A:
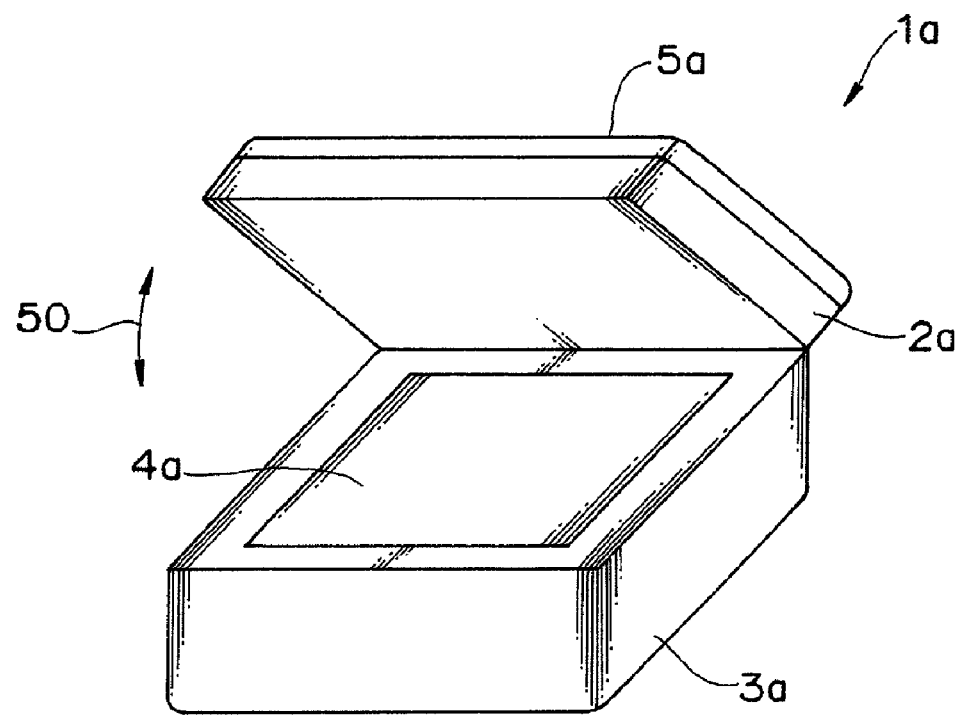
FIG. 1A is an exterior structural view that shows a casing for cosmetics on which a decorative plate for a casing in accordance with one embodiment of the present invention is mounted.
Figure 2A:
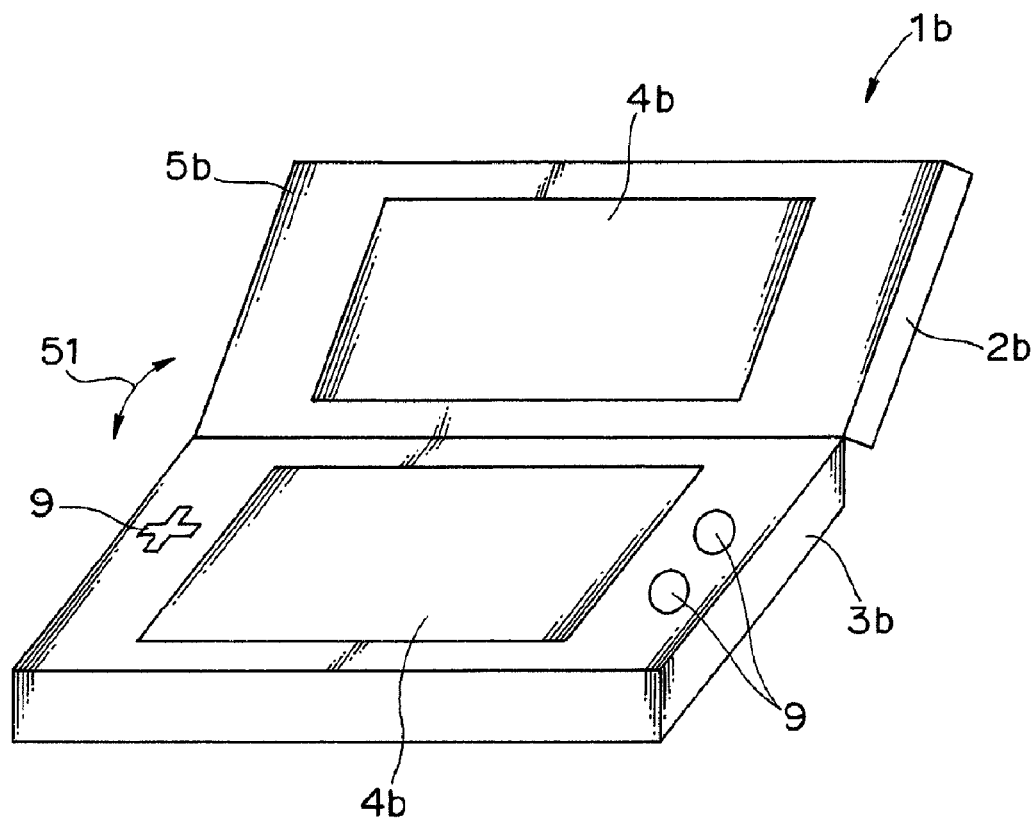
FIG. 2A is an exterior structural view that shows a portable game apparatus on which the decorative plate for a casing in accordance with the embodiment of the present invention is mounted.

FIG. 1A is an exterior structural view that shows a casing for cosmetics on which a decorative plate for casing in accordance with the embodiment of the present invention is mounted. FIG. 2A is an exterior structural view that shows a portable game apparatus on which the decorative plate for casing in accordance with the embodiment of the present invention is mounted.

A casing 1a for cosmetics, shown in FIG. 1A, is a rectangular parallelepiped casing made of an upper-side main body 2a and a lower-side main body 3a. The upper-side main body 2a and the lower-side main body 3a are coupled to each other with hinges so as to be opened and closed as indicated by an arrow 50. Cosmetics 4a are housed in the lower-side main body 3a, and upon using the cosmetics, the user opens the upper-side main body 2a so that the cosmetics housed inside the casing are exposed and utilized.

Here, on the surface of the upper-side main body 2a, a decorative plate 5a for casing is placed on the entire portion thereof. The decorative plate 5a for casing is placed on the upper face that is a face on which the user's view is drawn in most cases in the closed state of the upper-side main body 2a, and an outside appearance pattern of the casing 1a is formed by the decorative plate 5a.

A portable game apparatus 1b, shown in FIG. 2A, has a box shape made of an upper-side main body 2b and a lower-side main body 3b. The upper-side main body 2b and the lower-side main body 3b are coupled to each other with hinges so as to be opened and closed as indicated by an arrow 51.

A liquid crystal display 4b is attached to each of the upper-side main body 2b and the lower-side main body 3b. Moreover, operation buttons 9 are attached to the lower-side main body 3b, and when the upper-side main body 2b is opened, these are exposed to the outside to be made operable. The upper-side main body 2b also functions as a protective member for the operation buttons 9 on the lower-side main body.

When a user plays a game by using the portable game apparatus 1b, the user operates the operation buttons 9 located on the both ends of the liquid crystal display 4b of the lower-side main body 3b so that the results of the game are displayed on the liquid crystal display 4b placed on each of the upper-side main body 2b and the lower-side main body 3b.

A decorative plate 5b is attached to a portion of the upper-side main body 2b on which no liquid display 4b is formed. The decorative plate 5b is made of a plate-shaped member having a frame shape with a through hole having a size corresponding to the liquid crystal display 4b so as not to conceal the liquid crystal display 4b, and attached to the inner side face of the upper-side main body. As described above, since the face of the upper-side main body 2b on which the liquid crystal display is formed has neither buttons or the like formed thereon, nor portions that allow the user to grab the game apparatus during use, the face forms a portion readily viewed by the user upon using the game apparatus.

Figure 1B:
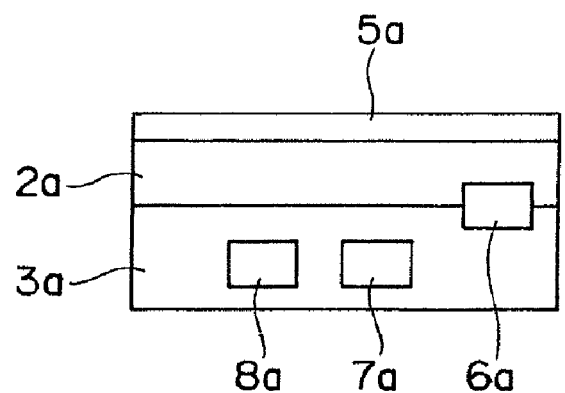
FIG. 1B is a view that schematically shows the inner structure of the casing for cosmetics of FIG. 1A.
Figure 2B:
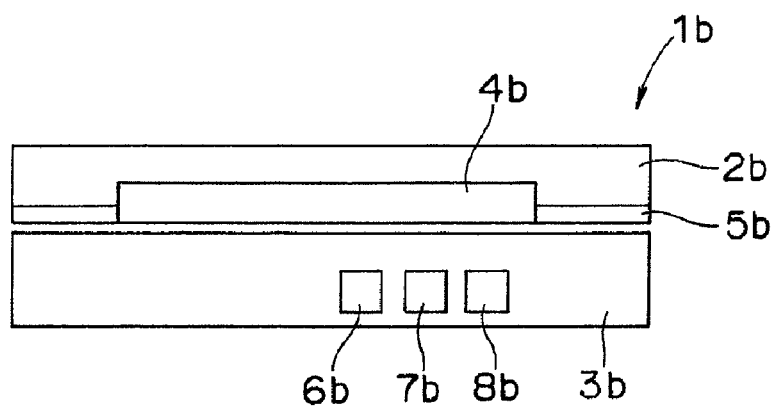
FIG. 2B is a view that schematically shows the inner structure of the portable game apparatus of FIG. 2A.

FIG. 1B is a view that schematically shows the inner structure of the casing for cosmetics shown in FIG. 1A. FIG. 2B is a view that schematically shows the inner structure of the portable game apparatus shown in FIG. 2A. In these two drawings, those functional blocks that are not required for changing the states of decorative plates 5a and 5b to be described later are not illustrated.

As shown in FIG. 1B, an opening/closing detection unit 6a for detecting an open/close state between the upper-side main body 2a and the lower-side main body 3a is installed in the casing 1a for cosmetics. Moreover, a battery 7a and a voltage-applying circuit 8a used for applying a voltage of the battery 7a to the decorative plate 5a are installed in the lower-side main body 3a. The opening/closing detection unit 6a detects an open/close state between the upper-side main body 2a and the lower-side main body 3a, and in accordance with the subsequent detected state, a voltage from the battery 7a is applied to the decorative plate 5a through the voltage-applying circuit 8a.

As shown in FIG. 2B, a state-detection unit 6b used for detecting a state of a game, a battery 7b, and a switching circuit 8b used for applying a voltage from the battery to the decorative plate 5b are installed in the portable game apparatus 1b. The state-detection unit 6b is a functional block used for detecting, for example, the level or state of a game progress, and more specifically, corresponds to one portion of a game program. The battery 7b, which is a voltage source used for applying a voltage to the decorative plate 5b, may be prepared as a battery for operating the game apparatus 1b, or as an exclusively-used button battery or the like. The switching circuit 8b switches between the application and non-application of a voltage from the battery 7b to the decorative plate 5b depending on the state of a game detected by the state-detection unit 6b. The switching circuit 8b may be configured by hardware, or may be prepared as software serving as one portion of the game program.

Figure 3A:
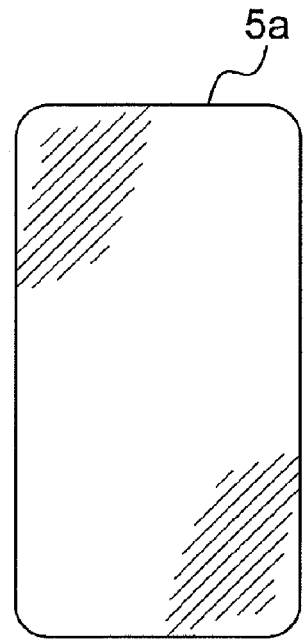
FIG. 3A is a view that shows an example of a display state in which reflective gloss from the decorative plate for a casing of FIG. 1A is emphasized.
Figure 3B:
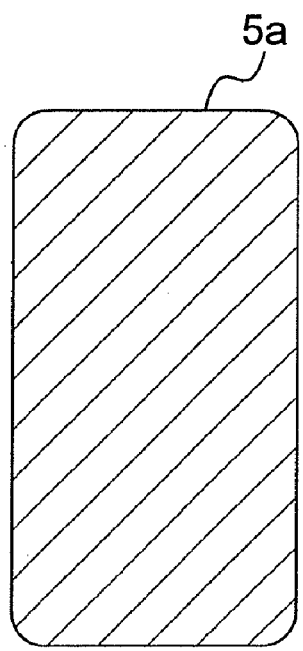
FIG. 3B is a view that shows an example of a display state in which the decorative plate for casing of FIG. 1A has an outside appearance of colored half mirror.

The decorative plates 5a and 5b, shown in the present embodiment, are allowed to make a switch between two display designs as shown in FIGS. 3A and 3B. The state shown in FIG. 3A provides a decorative state in which reflected gloss is emphasized over the entire surfaces of the decorative plates 5a and 5b. This state is prepared by a structure in which, since a polymer dispersion-type liquid crystal film 13, located beneath a color half mirror layer forming the decorative plate to be described later, is non-transparent, the reflection of the color half mirror layer located thereon is emphasized. The state shown in FIG. 3B provides a state in which the entire surface of the upper-side main body 2 has an outside appearance like a color half mirror. In this state, the polymer dispersion-type liquid crystal film 13, located beneath the color half mirror layer forming the decorative plate to be described later, is transparent; therefore, in comparison with the reflection of the color half mirror layer, a reflection-increasing layer and a backing layer, located beneath the color half mirror layer, are emphasized more to be visually recognized from the surface so that in this state, the colors of the reflection-increasing layer and the backing layer stand out on the surface. The decorative plates 5a and 5b mounted on the casing for cosmetics and the portable game apparatus in accordance with the present embodiment are allowed to make a switch between these states by using the following structure. The following description will discuss by typically exemplifying the decorative plate 5a shown in FIG. 1A; however, the basic structure of the decorative plate 5b shown in FIG. 2A is the same.

Figure 4:
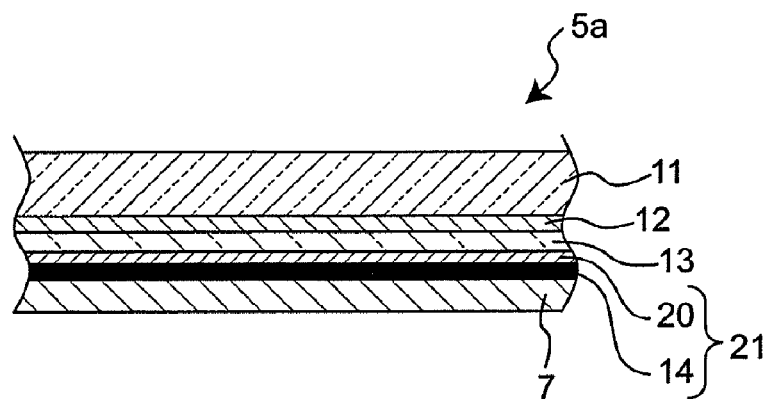
FIG. 4 is a schematic view that shows a cross-sectional structure of the decorative plate in accordance with the present embodiment.
Figure 5:
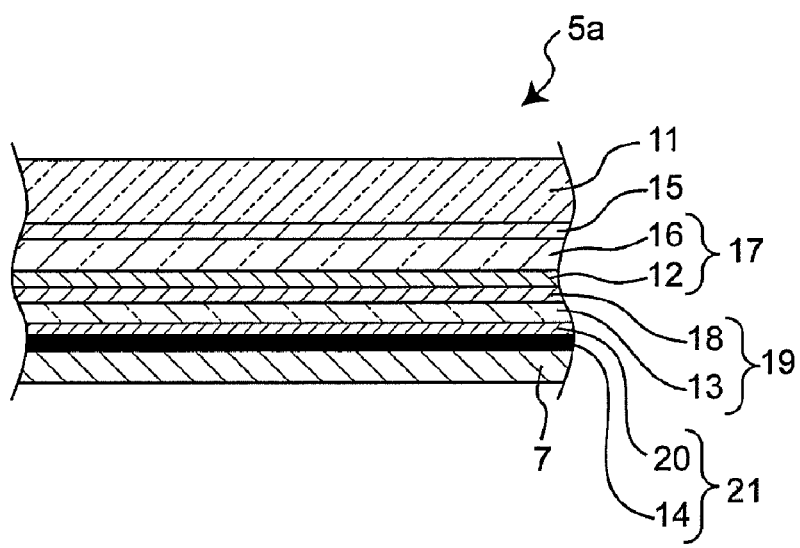
FIG. 5 is a schematic view that shows a modified example of the cross-sectional structure of the decorative plate in accordance with the present embodiment.

FIG. 4 is a schematic view that shows a cross-sectional structure of the decorative plate in accordance with the present embodiment. FIG. 5 is a schematic view that shows a modified example of the cross-sectional structure of the decorative plate in accordance with the present embodiment. The decorative plate 5a is configured by a plate-shaped transparent base member 11, a color half mirror layer 12, placed on the lower side of the transparent base member 11, that is made of a metal thin film subjected to a tint treatment, a polymer dispersion-type liquid crystal film 13, formed on the lower face of the color half mirror layer 12, that is one example of a transparency-switching film capable of switching between transmitting and non-transmitting states, a transparent reflection-increasing film layer 20, formed on the lower face of the polymer dispersion-type liquid crystal film 13, that is a composite film formed by alternately laminating high refractive-index films and low refractive-index films, and a backing layer 14 that is formed on the lower face of the reflection-increasing film layer in a tightly contact state without having an air layer interposed therebetween, which are successively laminated.

Here, FIG. 4 shows an example in which a polymer dispersion-type liquid crystal film 13 with the half color mirror layer 12 directly affixed thereto is attached onto the surface of the transparent base member 11 with a transparent bonding agent (not shown), and FIG. 5 shows an example in which the transparent base member 11, a half mirror film with a half mirror layer affixed onto the surface thereof, and an adhesive film formed by applying the transparent bonding agent to the surface of the polymer dispersion-type liquid crystal film are mutually bonded to one after another.

The transparent base member 11 is a plate-shaped member that is superior in transparency. A desired pattern may be affixed onto the surface of the transparent base member 11. The transparent base member 11 is made from a synthetic resin or reinforced glass or the like. Examples of the synthetic resin include: general-purpose resins, such as a polystyrene-based resin, a polyolefin-based resin, an ABS resin, an AS resin, an acryl-based resin, and an AN resin. Moreover, the examples further include: general purpose engineering resins, such as a polyphenylene oxide-polystyrene-based resin, a polycarbonate-based resin, polyacetal-based resin, a polycarbonate-modified polyphenylene ether resin, a polybutylene terephthalate resin, and a ultra-high molecular weight polyethylene resin, and super engineering resins, such as a polysulfone resin, a polyphenylene sulfide-based resin, a polyphenylene oxide-based resin, a polyallylate resin, a polyether imide resin, a polyimide resin, a liquid crystal polyester resin, and a polyallyl-based heat resistant resin. Although the transparent base member 11 is a plate-shaped member, the plate-shaped member is not limited to a flat plate as illustrated, but includes a thin molded product having a curved face.

Moreover, in a case of using reinforced glass as the transparent base member 11, although the material is not particularly limited, rather than generally-used so-called blue glass, white soda glass (so-called white glass) that is further superior in mechanical strength and the like may be preferably used. With respect to the method for manufacturing reinforced glass (the method for a reinforcing process), although not particularly limited, normally, a reinforcing method by the use of ion exchange is preferably used since a glass plate having a thickness of about 1 mm is used in most cases. The chemically reinforced glass, reinforced through ion exchange, is allowed to exhibit a great compression stress in comparison with wind-cooled reinforced glass, as described earlier.

Although not particularly limited, the thickness of the transparent base member 11 is preferably set in a range of from 0.3 to 1.1 mm, more preferably, from 0.5 to 0.8 mm, from the viewpoint of achieving light weight while maintaining sufficient strength.

The color half mirror layer 12 is arranged on the surface of the polymer dispersion-type liquid crystal film 13, and bonded to the back surface of the transparent base member 11 by using a bonding agent or the like. As shown in FIG. 4, it may be directly arranged on the surface of the polymer dispersion-type liquid crystal film 13, or as shown in FIG. 5, a half mirror film 17, formed by affixing the color half mirror layer 12 to the back face of a transparent film 16 formed separately from the polymer dispersion-type liquid crystal film 13, may be arranged so as to be bonded to the polymer dispersion-type liquid crystal film 13 with a transparent bonding agent 18. Here, the transparent film 16 and the color half mirror layer 12 may be switched with each other in their order of laminations.

Examples of the transparent film 16 forming the half mirror film 17 include engineering plastic materials, such as polycarbonate-based, polyamide-based, and polyether ketone-based plastic materials, and resins, such as acryl-based, polyethylene terephthalate-based, and polybutylene terephthalate-based resins.

The color half mirror layer 12 is made of a metal thin film that has been subjected to a tint treatment. The term, "tint", means a transparent color ink that is exemplified as a pigment ink or a dye ink having an extremely low density. Specific examples of the tint treatment include a method in which a metal thin film such as aluminum, chromium, tin, or indium is formed on the surface of the polymer dispersion-type liquid crystal film 13 by means of a vapor deposition or the like, when a pigment having an extremely low density is applied thereon through a gravure printing method as its tint treatment. Moreover, a metal thin-film layer is formed on the surface of a transparent film 16, and a gravure printing process may be carried out thereon. In still another tint treatment, a colored transparent resin film may be used as the transparent film 16. In this case, the colored transparent resin film having a desired tint to be applied may be used. For example, a yellow-colored transparent film 16 may be combined with a metal thin film having silver gloss to provide a surface gloss with a gold color.

The metal thin film may be formed by using, for example, a vacuum vapor deposition method, a sputtering method, a CVD method, a roll coater method, or the like. Here, the metal thin film is preferably formed to have such a film thickness that, although the metal thin film conceals the display in a light-off state, it allows displayed information in a light display state to transmit. The metal thin film is preferably formed so as to have a light transmittance in a range of from 60 to 80%.

Figure 6A:
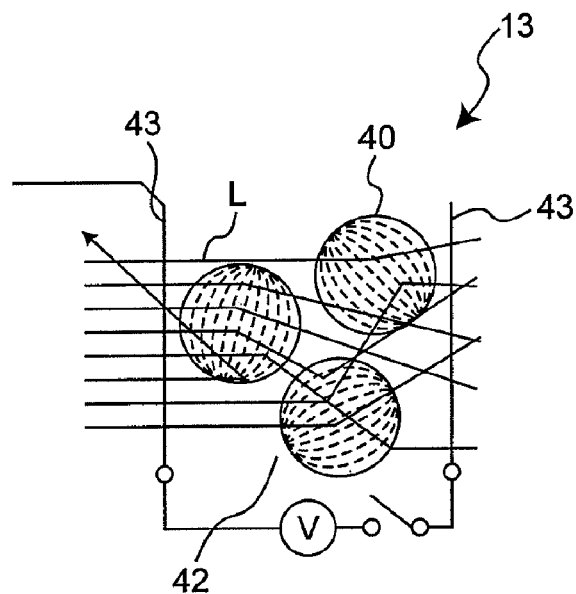
FIG. 6A is a view that shows a state of a polymer dispersion type liquid crystal film when no voltage is applied thereto.
Figure 6B:
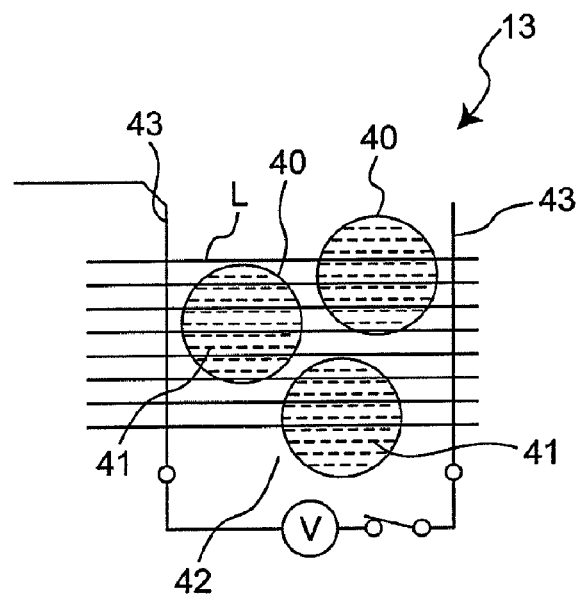
FIG. 6B is a view that shows a state of the polymer dispersion type liquid crystal film when a voltage is applied thereto.

The polymer dispersion-type liquid crystal film 13 is a film capable of switching between non-transmitting and transmitting states depending on the presence and absence of a voltage application, and its degree of transmittance can be freely changed by changing the voltage to be applied. As shown in FIGS. 6A and 6B, the polymer dispersion-type liquid crystal film 13 has a structure in which a transparent polymer film 42 formed by dispersing capsules 40 of nematic liquid crystal 41 therein is sandwiched between two sheets of films 43, each having a transparent conductive film affixed thereto.

The polymer dispersion-type liquid crystal film 13, which is used as an adhesive film 19 formed by applying a transparent bonding agent 18 to the surface of a film having the above-mentioned structure, is attached onto the surface of the half mirror film 17.

As shown in FIG. 6A, in a state with no voltage applied thereto, since the liquid crystal 41 having rod-shaped molecules are aligned along the inner wall of each capsule 40, light L, made incident on the film, is refracted in the surface and the inside of the capsule 40 by a difference in refractive indexes of the polymer and the liquid crystal and by birefringence of the liquid crystal. As a result, the light L is not allowed to progress straight and is scattered so that the film looks white.

In contrast, as shown in FIG. 6B, upon application of a voltage, since the liquid crystal molecules 41 behave so as to be aligned in a direction in which the voltage is applied, the liquid crystal molecules 41 are aligned perpendicularly to the electrodes. In this state, the capsules 40 are brought into a state equivalent to a no-interface state, and the light L, made incident thereon, is allowed to progress straight without being scattered. As a result, the film looks transparent.

The reflection-increasing film layer 20 is made of a transparent reflection-increasing film. More specifically, this is made of a composite film in which high refractive-index films and low refractive-index films are alternately laminated. This composite film increases reflection of light having a specific wavelength by interference of light rays occurring on the interface between the high refractive-index film and the low refractive-index film. When the reflection-increasing film layer 20 is made to have high reflection of 60% or more, it becomes possible to apply a tint. With respect to the combination between the high refractive-index film and the low refractive-index film, for example, a combination between a $TiO_2$ film and a $SiO_2$ film, or the like is preferably used. Moreover, the composite film is formed into a structure with three layers to ten layers on demand, with each layer being set to 100 nm or less, based upon a tint to be applied. The method for forming the composite film includes an EB vapor deposition method, a sputtering method, or the like.

The backing layer is preferably formed so as to be made tightly in contact with the lower face of the reflection-increasing film layer 20, with no air layer being interposed therebetween. In a case where an air layer is interposed, reflection occurs on the interface, with the result that the backing layer portion tends to look white.

The backing layer 14 is made of a solid pattern. In the present embodiment, a black-colored solid pattern is adopted. Here, the backing layer 14 may have another color.

The polymer dispersion-type liquid crystal film 13 can make different the outside appearance color of the casing that is visually recognized through the half mirror layer 12 of the decorative plate 5a by the shutter effect. That is, when the polymer dispersion-type liquid crystal film 13 is in the non-transmitting state, the light that has reached the polymer dispersion-type liquid crystal film 13 is reflected by the white polymer dispersion-type liquid crystal film 13 so that the color half mirror layer 12 is viewed through the white background. In contrast, in a case where the polymer dispersion-type liquid crystal film 13 is in the transmitting state, since the polymer dispersion-type liquid crystal film 13 is transparent, the light, made incident thereon, is allowed to transmit the color half mirror layer 12 and the polymer dispersion-type liquid crystal film 13 so that colored reflected light from the reflection-increasing film layer 20 subjected to the backing is visually recognized. By varying the decorative reflection colors formed by the color half mirror layer 12 and the reflection-increasing film layer and the backing layer 14, the colors of the two layers may be mixed to form another tone, and consequently, variations of various colors can be obtained.

That is, the casing 1a on which the decorative plate for a casing in accordance with the present embodiment is mounted is capable of switching between the states shown in FIGS. 3A and 3B in its designing property given by the decorative plate 5a as described above, by switching between the transmitting and non-transmitting states of the polymer dispersion-type liquid crystal film 13.

That is, in a state shown in FIG. 3A, by bringing the polymer dispersion-type liquid crystal film 13 into the non-transmitting state, the color half mirror layer 12 is visually recognized on the white background so that decorative state, made only by the color half mirror layer, is prepared with the entire portion thereof being colored by the color half mirror layer 12. In a state shown in FIG. 3B, by bringing the polymer dispersion-type liquid crystal film 13 into the transmitting state, an outside appearance of the half mirror on the background of colors formed by the reflection-increasing film layer 20 and the backing layer 14 is prepared.

The casing 1a on which the decorative plate for a casing in accordance with the present embodiment is mounted makes it possible to distinguish the state of the casing 1a at first glance, by making the designing property given by the decorative plate 5a different depending on the state of the casing 1a.

Moreover, the decorative plate for a casing in accordance with the present embodiment may have a structure in which, in place of the metal thin film that has been subjected to a tint treatment, the color half mirror layer 12 can be made of a reflection-increasing film that has been subjected to a tint treatment. That is, in this structure, the reflection-increasing film that has been subjected to a tint treatment and the transparent reflection-increasing film are used for sandwiching the polymer dispersion-type liquid crystal film 13 from the front side and the back side. Since no metal material is contained therein, this structure is desirably used for applications that call for an electric wave transmitting property in the protective plate. The structure and the forming method for the above-mentioned reflection-increasing film layer 20 may be applied to a reflection-increasing film for use in the color half mirror layer 12. Moreover, the tint treatment for the metal thin-film may be applied to the tint treatment for the reflection-increasing film. Here, the reflection-increasing film for use in the color half mirror layer 12 is desirably designed to have such a film thickness that, although the reflection-increasing film conceals the display in the light-off state, it allows displayed information in a light display state to transmit. Moreover, the reflection-increasing film to be used for the color half mirror layer 12 is preferably formed so as to have a light transmittance in a range of from 60 to 80%.

As shown in Tables 1 and 2, the casing 1a varies the design of the decorative plate for a casing depending on the states of the casing 1a. The design of the decorative plate for a casing is varied depending on the closed state and the open state of the upper-side main body 2a. Here, Table 1 shows how the casing looks when both of the hues that are exhibited by the reflection-increasing layer and the half color mirror layer are similar colors of bluish colors, and Table 2 shows how the casing looks when the hues that are exhibited by the reflection-increasing layer and the half color mirror layer are a blue color and an orange color, which are respectively different.

TABLE 1

| State | Closed | Opened |
| --- | --- | --- |
| Reflection-increasing film layer | Blue | Blue |
| Half mirror layer | Metallic color with faint blue color reflection | Transmitted |
| Liquid crystal film | Clouded | Transparency |
| Appearance of panel | Faint blue-color mirror | Bluish black-color mirror |
| Example of appearance | FIG. 3A | FIG. 3B |

TABLE 2

| State | Closed | Opened |
| --- | --- | --- |
| Reflection-increasing film layer | Blue | Blue |
| Half mirror layer | Metallic color with faint orange color reflection | Transmitted |
| Liquid crystal film | Clouded | Transparency |
| Appearance of panel | Faint orange-color mirror | Blue-color mirror |
| Example of appearance | FIG. 3A | FIG. 3B |

As shown in Tables 1 and 2, in the closed state of the upper-side main body 2a, the entire portion shown in FIG. 3A is brought into a state with a mirror-like reflection gloss by the color half mirror layer 12. At this time, since a clouded non-transmitting state is formed when no voltage is applied to the polymer dispersion-type liquid crystal film 13, the panel appearance exhibits the color of the color half mirror layer 12.

In the opened state of the upper-side main body 2a, the entire appearance, as shown in FIG. 3B, exhibits a mirror state with a color exerted by the reflection-increasing film. In this state, the polymer dispersion-type liquid crystal film 13 becomes transparent with a voltage being applied thereto, and since a black-based half mirror 21 of the reflection-increasing film layer 20 and the backing layer 14 is visually recognized from outside, the panel appearance exhibits the mirror color of the reflection-increasing film over the entire panel. In a case where the color half mirror layer 12 and the reflection-increasing film layer 20 have similar colors as shown in Table 1, a color closer to the color of the reflection-increasing film layer 20 is exhibited. In contrast, in a case where the color half mirror layer 12 and the reflection-increasing film layer 20 have different colors as shown in Table 2, a mixed color thereof is exhibited.

As described above, in the casing 1a in accordance with the present embodiment, by switching the applied voltage to the polymer dispersion-type liquid crystal film 13 depending on its opened/closed state, the background color of the color half mirror is made different so that it is possible to make the designing property of the decorative plate different. Moreover, since the decorative plate itself can be made thinner, when attached onto the casing, its designing property on the outside appearance is hardly impaired.

By properly combining the arbitrary embodiments of the aforementioned various embodiments, the effects possessed by the embodiments can be produced.

The decorative plate for a casing in accordance with the present invention can improve the designing property of casings that are used for containers and the like for many commodities and electronic apparatuses.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The invention claimed is:

1. A decorative plate for a casing, which is attached to a surface of a casing so as to decorate said casing, comprising:
   a plate-shaped transparent base member;
   a color half mirror layer that is placed on a lower side of said transparent base member, and made of a metal thin-film that has been subjected to a tint treatment;
   a transparency-switching film that is placed on a lower face of said color half mirror layer, for switching between transmitting and non-transmitting states electrically;
   a transparent reflection-increasing film layer that is placed on a lower face of said transparency-switching film, and is a composite layer formed by alternately laminating a high refractive-index film and a low refractive-index film; and,
   a backing layer that is formed on a lower face of said reflection-increasing film layer in a tightly contact state without having an air layer interposed therebetween, which are successively laminated.

2. The decorative plate for a casing according to claim 1, wherein said transparency-switching film is formed by a polymer dispersion-type liquid crystal film and adapted for switching between transparent and white non-transparent states upon application of a voltage.

3. The decorative plate for a casing according to claim 2, wherein said transparency-switching film becomes said white non-transparent state when a voltage is applied thereto, and also becomes said transparent state when no voltage is applied thereto.

4. The decorative plate for a casing according to claim 1, wherein said reflection-increasing film layer is made of a layer on which a dielectric film made from a transparent inorganic oxide is laminated.

5. The decorative plate for a casing according to claim 1, wherein, in place of said metal thin film that has been subjected to the tint treatment, said color half mirror layer is made of another reflection-increasing film that has been subjected to a tint treatment.

6. The decorative plate for a casing according to claim 1, wherein said color half mirror layer is placed on a surface of a transparent film, and formed by bonding said transparent film and said transparent base member to each other, with a surface of said film on a side having no color half mirror layer being made tightly in contact with a surface of said transparent base member.

7. The decorative plate for a casing according to claim 1, characterized in that said backing layer is made of a black solid pattern.

8. A casing to a surface of which said decorative plate for a casing according to claim 1 is attached, comprising:
   a voltage-applying unit for switching between application and non-application states of a voltage to said transparency-switching film depending on states of said casing; and
   a battery housing unit for housing a battery serving as a voltage source for a voltage to be applied by said voltage-applying unit,
   wherein said decorative plate is allowed to have a different design depending on a state of said casing.

* * * * *